(12) United States Patent
Napoles et al.

(10) Patent No.: US 11,349,191 B1
(45) Date of Patent: *May 31, 2022

(54) RING-SHAPED DEVICES WITH COMBINED BATTERY AND ANTENNA ASSEMBLIES

(71) Applicant: Amazon Technologies, Inc., Seattle, WA (US)

(72) Inventors: Adrian Napoles, Bellevue, WA (US); Ulf Jan-Ove Mattsson, Campbell, CA (US); Sarah Graber, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 177 days.

This patent is subject to a terminal disclaimer.

(21) Appl. No.: 16/572,663

(22) Filed: Sep. 17, 2019

(51) Int. Cl.
| | |
|---|---|
| *H01Q 1/22* | (2006.01) |
| *H05K 1/02* | (2006.01) |
| *H01Q 1/27* | (2006.01) |
| *H05K 7/14* | (2006.01) |
| *H01M 10/42* | (2006.01) |
| *H04R 1/08* | (2006.01) |
| *H04R 1/02* | (2006.01) |
| *H04R 1/04* | (2006.01) |
| *G10L 15/22* | (2006.01) |

(52) U.S. Cl.
CPC .......... *H01Q 1/22* (2013.01); *H01M 10/4257* (2013.01); *H01M 10/4264* (2013.01); *H01Q 1/273* (2013.01); *H04R 1/028* (2013.01); *H04R 1/04* (2013.01); *H04R 1/08* (2013.01); *H05K 1/0277* (2013.01); *H05K 7/1427* (2013.01); *G10L 15/22* (2013.01); *G10L 2015/223* (2013.01); *H01M 2220/30* (2013.01); *H01Q 1/2291* (2013.01); *H04R 2201/02* (2013.01)

(58) Field of Classification Search
CPC ........ H01Q 1/22; H01Q 1/273; H01Q 1/2291; H04R 1/04; H04R 1/08; H04R 1/028; H04R 2201/02; H05K 1/0277; H05K 7/1427; H01M 10/4264; H01M 10/4257; H01M 2220/30; G10L 15/22; G10L 2015/223

See application file for complete search history.

(56) References Cited

U.S. PATENT DOCUMENTS

| | | | |
|---|---|---|---|
| 4,419,770 A * | 12/1983 | Yagi ..................... | G04B 47/025 368/10 |
| 9,673,871 B2 * | 6/2017 | Yeh ......................... | H04W 4/80 |
| 2009/0196444 A1 * | 8/2009 | Solum .................... | H01Q 1/241 381/315 |

(Continued)

*Primary Examiner* — Dimary S Lopez Cruz
*Assistant Examiner* — Bamidele A Jegede
(74) *Attorney, Agent, or Firm* — Eversheds Sutherland (US) LLP

(57) ABSTRACT

Systems, methods, and computer-readable media are disclosed for ring-shaped devices with combined battery and antenna. In one embodiment, an example device may include an inner shell, and an outer shell coupled to the inner shell, where the outer shell and inner shell together form a first side portion, a second side portion, and a lower portion of the ring-shaped device. The device may include an antenna element coupled to the outer shell and the inner shell, where the antenna element forms an upper portion of the ring-shaped device, a battery disposed adjacent to the antenna element, and a flexible printed circuit assembly disposed along the first side portion, wherein the flexible printed circuit assembly is coupled to the antenna element and the battery.

19 Claims, 6 Drawing Sheets

(56) References Cited

U.S. PATENT DOCUMENTS

| | | | |
|---|---|---|---|
| 2010/0190435 A1* | 7/2010 | Cook | H02J 7/025 455/41.1 |
| 2012/0122519 A1* | 5/2012 | Jochheim | H01Q 9/0407 455/556.1 |
| 2012/0268074 A1* | 10/2012 | Cooley | H01M 10/44 320/130 |
| 2013/0083496 A1* | 4/2013 | Franklin | G09G 3/2092 361/749 |
| 2013/0194540 A1* | 8/2013 | Pugh | B29D 11/00038 351/159.03 |
| 2015/0029060 A1* | 1/2015 | Jeon | H01Q 1/48 343/702 |
| 2015/0146355 A1* | 5/2015 | Goyal | H05K 1/189 361/679.03 |
| 2015/0255860 A1* | 9/2015 | Lienau | H01Q 9/16 343/702 |
| 2015/0346766 A1* | 12/2015 | Justice | G06F 1/188 361/679.03 |
| 2016/0020506 A1* | 1/2016 | Mahanfar | H01Q 9/42 343/718 |
| 2016/0070234 A1* | 3/2016 | Lee | A44C 5/14 368/282 |
| 2016/0126659 A1* | 5/2016 | Kim | H04R 1/1066 439/37 |
| 2016/0156071 A1* | 6/2016 | Yamakaji | H01M 10/48 429/61 |
| 2016/0190678 A1* | 6/2016 | Hong | H01Q 1/273 343/700 MS |
| 2016/0254587 A1* | 9/2016 | Jung | H02J 50/12 343/702 |
| 2016/0294038 A1* | 10/2016 | Lo | H01Q 1/48 |
| 2016/0322999 A1* | 11/2016 | Kim | H01Q 1/36 |
| 2016/0344060 A1* | 11/2016 | Asano | H01M 10/0525 |
| 2016/0344096 A1* | 11/2016 | Erentok | H01Q 13/18 |
| 2016/0380342 A1* | 12/2016 | Kenoun | H01Q 1/44 343/718 |
| 2017/0025747 A1* | 1/2017 | Vanjani | H01Q 1/273 |
| 2017/0093021 A1* | 3/2017 | Kim | H01Q 7/00 |
| 2017/0099087 A1* | 4/2017 | Yeh | H04B 5/00 |
| 2017/0125892 A1* | 5/2017 | Arbabian | A61B 5/686 |
| 2017/0141462 A1* | 5/2017 | Lin | H01Q 1/273 |
| 2017/0155187 A1* | 6/2017 | Lin | H01Q 1/273 |
| 2017/0179580 A1* | 6/2017 | Park | H01Q 5/30 |
| 2017/0207519 A1* | 7/2017 | Tzanidis | H04B 1/38 |
| 2017/0214127 A1* | 7/2017 | Newham | H01Q 1/40 |
| 2017/0237149 A1* | 8/2017 | Lee | G06K 7/00 361/679.21 |
| 2017/0303646 A1* | 10/2017 | Bricken | G06F 1/1652 |
| 2017/0358847 A1* | 12/2017 | Cho | H05K 7/1427 |
| 2018/0041617 A1* | 2/2018 | Shamsoddini | H01Q 9/42 |
| 2018/0343989 A1* | 12/2018 | Mclear | A44C 9/0015 |
| 2019/0074585 A1* | 3/2019 | Vavelin | H01Q 7/00 |
| 2019/0123429 A1* | 4/2019 | Ramaci | G01S 19/36 |
| 2019/0181544 A1* | 6/2019 | Kim | H01Q 1/273 |
| 2019/0190128 A1* | 6/2019 | Shaker | A44C 9/0053 |

* cited by examiner

RING-SHAPED DEVICES WITH COMBINED BATTERY AND ANTENNA ASSEMBLIES

BACKGROUND

Electronic devices may include components for wireless communication. For example, smartphones may include components to communicate data both through a WiFi network connection, as well as through a cellular network connection. In some instances, electronic devices like ring-shaped devices may have small footprints or sizes, and may therefore have limited space for wireless communication components, such as antennae and the like. In such electronic devices, wireless communication capabilities may be desired, regardless of a size of the electronic device.

Figure 1:
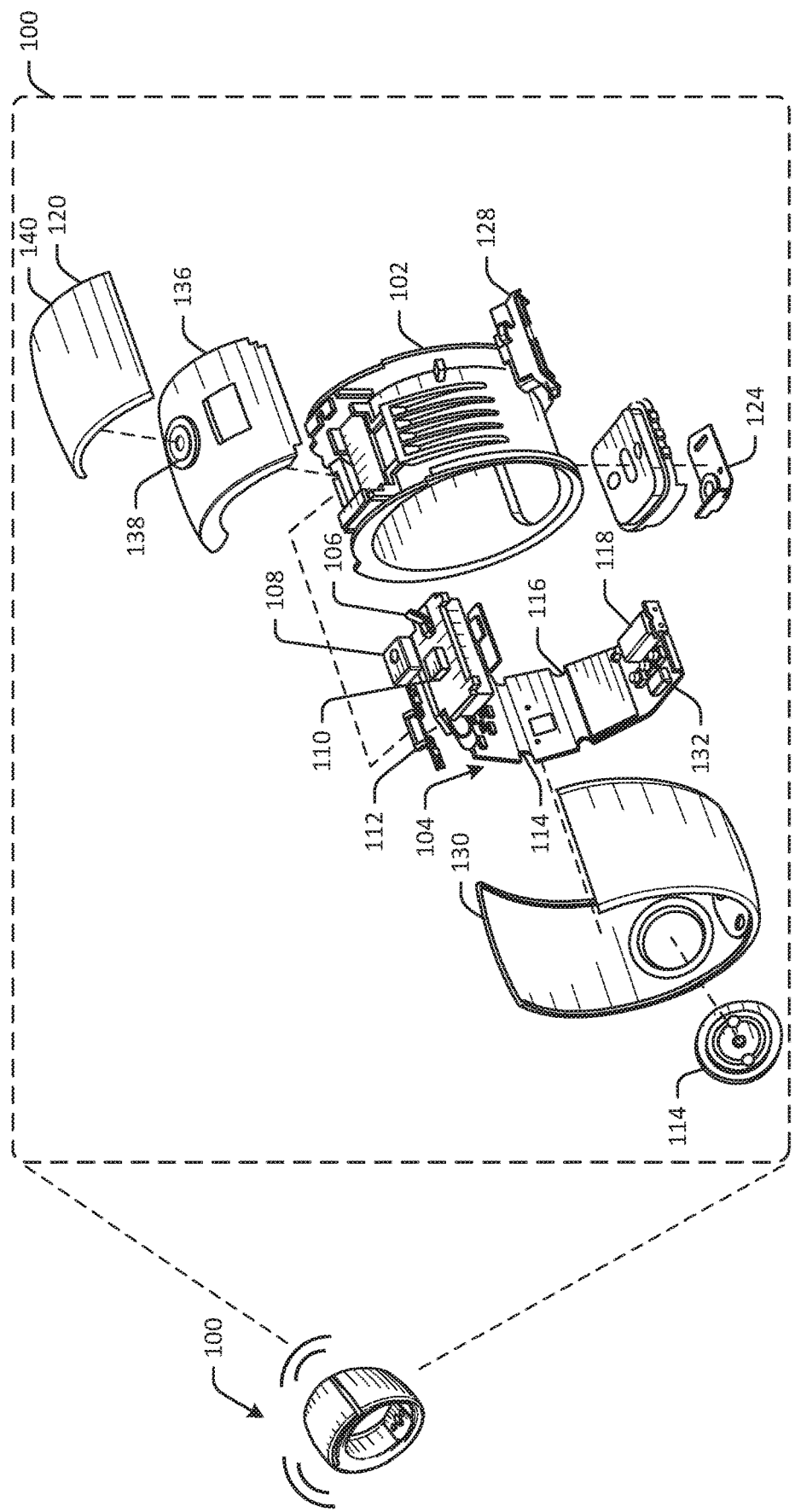
FIG. 1 is a schematic drawing of a ring-shaped device with a combined battery and antenna in accordance with one or more embodiments of the disclosure.

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. The use of the same reference numerals indicates similar, but not necessarily the same or identical components. Different reference numerals may be used to identify similar components. Various embodiments may utilize elements or components other than those illustrated in the drawings, and some elements and/or components may not be present in various embodiments. The use of singular terminology to describe a component or element may encompass, depending on the context, a plural number of such components or elements and vice versa.

DETAILED DESCRIPTION

Overview

Electronic devices may be used to wirelessly send and receive data. For example, certain electronic devices, such as smartphones, tablets, laptop computers, and other mobile devices, may include one or more components that can be used to wirelessly communicate over one or more networks. For wireless communication, electronic devices may use certain components, such as radios, transceivers, antennae, and/or other components. Certain electronic devices may be small in size or may have small footprints, and may therefore have limited space (internal or external) in which electronic components are placed.

Wearable devices may be devices that are small in size or that have small footprints. Wearable devices include electronic devices that a user can wear, for example, as an accessory, or can otherwise take with them, such as in the user's pocket. Wearable devices may include watches, bracelets, glasses, electronic trackers, and so forth. Because wearable devices may be worn by users, factors of the device including size, weight, shape, and the like may affect a user experience with the device. For example, a device that is bulky, heavy, or too large may be impractical for certain users to use or wear. In addition, reducing a size or footprint of a device may affect the functionality of the device. For example, reducing the size of a battery in the device may reduce an amount of time the device can operate without being recharged. Accordingly, a size, shape, weight, and/or other factors may impact not only a user experience with a wearable device, but functionality of the device as well. However, wireless communication capabilities for such devices may be desired. Accordingly, ring-shaped devices with combined batteries and antennas may be desired.

Embodiments of the disclosure include batteries with housings that form antenna elements (e.g., resonant structures that act as an antenna, etc.). Such batteries may be used in electronic devices such as wearable devices, where the battery housing acts or serves as a wireless communication antenna for the electronic device. As a result, a separate antenna may not be needed in the device, thereby reducing a number of components and/or an amount of space consumed by electronic components of the electronic device. Electronic devices may therefore have a reduced footprint, while maintaining wireless communication capabilities.

Certain electronic devices may be configured to communicate over different wireless communication protocols, such as via a WiFi connection and an RFID connection (or Bluetooth, Zigbee, etc.), in which case one or more additional antennae may be included in the electronic device for one of the wireless communication protocols, such as the WiFi communication protocol, while the battery housing can serve as the antenna for the RFID communication protocol.

Antenna elements of the disclosure may be metal or metal-based, and may form shrouds that encapsulate, surround, or partially surround a battery of the ring-shaped device. Antenna elements may be used as a driven element of an antenna system when the antenna element is connected to a transceiver of the ring-shaped device. In some embodiments, the antenna element may form a battery housing for the battery, such that the antenna element and the battery together form an integrated antenna, or may otherwise act as an antenna for the ring-shaped device. Electronic devices may therefore include wireless communication capabilities while maintaining reduced or small footprints, as well as relatively small internal spaces for electronic components.

Batteries of the disclosure may be any suitable battery, such as a lithium-ion battery, an alkaline primary cell battery, and may have exterior casings or housings. In some instances, the battery may be a flexible pouch battery.

Embodiments of the disclosure may include combined battery and antenna assemblies that consume less physical space inside a device relative to devices with separate batteries and antennae. Embodiments may therefore reduce a footprint or amount of space consumed within a device. Different wearable devices may have different capabilities. For example, a wearable glasses device may be configured to provide augmented reality information on a display of the glasses, while a wearable watch device may be configured to detect heartrate, monitor physical activity, and so forth. Embodiments of the disclosure include combined battery and antenna assemblies that can be included in any suitable device, such as ring-shaped electronic devices that may be worn by users as a ring around the user's finger. The ring-shaped devices may be configured to detect voice or speech input and may be configured to wirelessly communicate with other electronic devices. For example, in some instances, a user may be unable or unwilling to take a smartphone out of the user's pocket or bag. However, the user may wish to set a timer, send a message, or perform another task. Using the ring-shaped devices described herein, the user may speak a voice command to the ring-shaped device, and the ring-shaped device may send the voice command to the user's smartphone or other device. The user may therefore not have to physically interact with the smartphone. Other examples of functionality include using the ring-shaped devices to control other electronic devices, such as televisions, stereos, content streaming devices, and so forth, sending voice messages, receiving information (e.g., audible presentation of a current time, etc.), and other functionality.

Because the user may wear the ring-shaped device around a finger, a size of the ring-shaped device may be limited. In addition, wireless performance of the ring-shaped device, such as transmission range, may be affected by contact between the ring-shaped device and adjacent fingers. For example, the nearby fingers may absorb radio waves transmitted by the ring-shaped device. Accordingly, the combined battery and antenna assemblies described herein may reduce or maintain an amount of space consumed within the larger device, while improving or maintaining wireless performance.

This disclosure relates to, among other things, systems, methods, computer-readable media, techniques, and methodologies for combined battery and antenna assemblies. Embodiments may include batteries with housings that may serve as antennae for wireless communication. Such embodiments may eliminate separate antenna that may otherwise be positioned within a ring-shaped device.

In some embodiments, a combined battery and antenna assembly may be positioned at the top ("top," "bottom," and "size" as used herein are for illustrative purposes as reference positions, and are not absolute positions) of a ring-shaped electronic device, such that the combined battery and antenna assembly is exposed to the environment when worn by a user. As a result, antenna performance may not be negatively impacted by contact with a user's finger, adjacent fingers, or palm. Some embodiments include an antenna element that is a thin layer of metal that at least partially surrounds the battery. The antenna element may be configured to isolate direct current from battery leads of the battery. The battery leads may also be configured to short circuit alternating current to the antenna element using one or more capacitors. The antenna element may include a metal surface that can be used to provide cosmetic or aesthetic finishes. The antenna element may protect the battery and may form a low loss surface that supports radio frequency currents to generate electromagnetic waves.

By combining the antenna and battery, device volume is reduced by using components for more than one function. In some embodiments, the battery and antenna assembly may be disposed at a top or upper portion of a ring-shaped device. The antenna element may be a thin metal shroud that covers the battery. Ring-shaped devices may include components to bypass radio frequencies of the battery terminals, so as to prevent radio frequency energy from being absorbed by the battery. The battery may be choked using one or more inductors to keep radio frequency energy from entering the battery. Some embodiments may include antenna feed points and antenna ground points coupled to the battery.

Referring to FIG. 1, a schematic drawing of a ring-shaped device 100 with a combined battery and antenna assembly is illustrated in exploded view in accordance with one or more embodiments of the disclosure. In the illustrated example, a user may use the ring-shaped device 100 to communicate with another electronic device, such as a smartphone. To interact with the ring-shaped device 100, the user may, in some instances, interact with a button or other component of the ring-shaped device 100 to initiate monitoring for voice input. In other instances, the user may interact with the ring-shaped device 100 by speaking a wake word, such as "Alexa," or by making a certain gesture, such as lifting the user's hand towards the user's mouth. The ring-shaped device 100 may listen for a request or voice command, and may respond accordingly. For example, the ring-shaped device 100 may cause one or more operations to be performed, such as controlling other devices (e.g., televisions, lights, radios, thermostats, etc.), may respond with audio or visual information (e.g., weather, news, messages, etc.), and/or may perform different actions in response to a request or command.

The ring-shaped device 100 may be configured to communicate wirelessly with one or more other devices over one or more networks. The ring-shaped device 100 may have a relatively small footprint, as well as limited internal space within a housing of the ring-shaped device 100. The ring-shaped device 100 may be powered by one or more batteries. As shown in FIG. 1, the ring-shaped device 100 may use a battery housing of a battery as an antenna element for wireless communication, thereby eliminating the need for a separate wireless antenna, and/or the need for separate space for the battery. The antenna element of the ring-shaped device 100 may facilitate wireless communication, and the ring-shaped device 100 may therefore maintain a relatively small form factor and/or footprint.

The ring-shaped device 100 may have a housing. The housing may be ring-shaped and/or substantially circular, and may be formed of one or more portions. For example, the housing may include an inner shell 102 and an outer shell 130. An antenna element 140 may form at least a portion of the housing, such as a top portion or upper portion ("bottom," "top," "upper," "lower," and "side" as used herein describe relative positioning for illustrative examples and not absolute positioning). The housing may include a curved upper portion, a curved lower portion, a first curved side portion, and a second curved side portion.

The ring-shaped device 100 may include the inner shell 102. The inner shell 102 may be in contact with a user's finger when the ring-shaped device 100 is worn by a user. The inner shell 102 may be formed of metal, such as stainless steel, and in some instances, may be formed of metal injection molded Panacea material. The inner shell 102 may be formed of metal to improve biocompatibility and/or the feel of the ring-shaped device 100 to a user.

The inner shell 102 may be coupled to the outer shell 130. The outer shell 130 may be formed of a metal material, such as titanium. In some embodiments, the outer shell 130 may be formed of a stamped titanium material. The inner shell 102 may be disposed within the outer shell 130 and may be coupled using an adhesive, such as glue. In some embodiments, the inner shell 102 may be a circular inner shell, in that the outer surface of the inner shell 102 that is in contact with a user's finger during use may be circular or substantially circular. The circular portion of the inner shell 102 may form an inner surface of the housing of the ring-shaped device.

The antenna element 140 may be disposed along the top of the ring-shaped device 100 and may be formed of metal, such as a stamped titanium material. The antenna element 140 may form a portion of the outer surface of the housing of the ring-shaped device 100. The antenna element 140 may be a curved antenna element, so as to maintain a curvature of an outer surface of the ring-shaped housing. The outer shell 130 may be coupled to the curved antenna element 140. In some embodiments, one or more holes or apertures may be formed in the antenna element 140, and a microphone may be aligned with the one or more holes or apertures. In some embodiments, the inner shell 102, the outer shell 104, the antenna element 140, and/or an optional plastic carrier component may be glued together for structural sealing. The antenna element 140 may be a metal component and may have one or more sides.

The antenna element 140 may be formed at least partially of, or entirely of, a conductive material. The antenna element 140 may be a resonant structure that resonates at a predetermined frequency, and therefore serves as an antenna for the ring-shaped device 100. For example, the antenna element 140 may be configured to resonate at a frequency of 900 MHz, 2.4 GHz, 5.8 GHz, or another frequency. The antenna element 140 may resonate in response to the RF output from the radio transceiver/transmitter 130, and/or during receipt of wireless communications from another device. The frequency at which the antenna element 140 resonates may be a function of, in some embodiments, a size of the antenna element 140 (e.g., a surface area of the antenna element 140, a length and width of the antenna element 140, etc.). In some embodiments, certain features may be included as part of the antenna element 140 that may impact or affect the frequency at which the housing resonates, such as slots or openings in the housing, flexible antenna attachments, and other features.

In some instances, the antenna element 140 may be a thin metal layer adhered to a battery 120, while in other instances, the antenna element 140 may form a housing or partial housing for the battery 120. The battery 120 may be coupled to the antenna element 140. The battery 120 may be disposed adjacent to, such as underneath the antenna element 140. The battery 120 may be a power source for the ring-shaped device 100. The battery 120 may be a curved battery. For example, the battery 120 may have a flexible outer surface and may be in a flexible pouch or flexible package configuration. The battery 120 may be configured to power the ring-shaped device 100. The battery 120 may be any suitable battery type, such as lithium ion, nickel cadmium, etc. The battery 120 may be rechargeable. The battery 120 may be disposed in the housing of the ring-shaped device 100 along an upper portion of the ring-shaped device 100.

The ring-shaped device 100 may include the radio transceiver/transmitter 130. In some embodiments, the ring-shaped device 100 may include only a receiver, only a transmitter, or a transceiver. In some embodiments, the radio transceiver/transmitter 130 may be a writeable RFID receiver. The radio transceiver/transmitter 130 may be configured to facilitate wireless communication for the device. The radio transceiver/transmitter 130 may be coupled to the electrical system 120 via one or more input/output (TO) lines, which may be used for instructions or data transfer between the electrical system 120 and/or the controller and the radio transceiver/transmitter 130. The radio transceiver/transmitter 130 may be electrically coupled to and/or powered by the battery 160, and may be grounded by the electrical system 120. Other embodiments may include any suitable wireless communication component, such as at least one of a transmitter, a receiver, and/or a transceiver.

The radio transceiver/transmitter 130 may output one or more radio frequency signals having a certain frequency. For example, the radio transceiver/transmitter 130 may be configured to output data over a WiFi radio frequency, an RFID radio frequency, a Bluetooth radio frequency, a ZigBee radio frequency, a Near Field Communication radio frequency, or another radio frequency.

One or more components may be disposed within the housing of the ring-shaped device 100, such as the battery 120. In another example, a flexible printed circuit assembly 104 may be disposed inside the housing along a first side of the ring-shaped device 100. A number of components may be coupled to or mounted on the flexible printed circuit assembly 104. For example, an antenna feed component 106 may be disposed at a first segment of the flexible printed circuit assembly 104. The antenna feed component 106 may couple the flexible printed circuit assembly 104 (and/or one or more components of the flexible printed circuit assembly 104) to the antenna element 140. In some embodiments, the antenna feed component 106 may be configured to electrically couple the flexible printed circuit assembly 104 to the antenna element 140. An optional first microphone 108 may be disposed on the flexible printed circuit assembly 104 adjacent to the antenna feed component 106. The optional first microphone 108 may be disposed at or near an upper portion of the ring-shaped device 100, and may therefore be used for noise cancellation, as a user may not wish to speak into the upper portion of the ring-shaped device 100 (e.g., the user may find doing so awkward, etc.). The optional first microphone 108 may be configured to cancel ambient noise. A haptic feedback ring-shaped device 100 may be disposed on the first segment of the flexible printed circuit assembly 104 adjacent to the antenna feed component 106. The haptic feedback ring-shaped device 100 may be a resonant haptic device and may include a piezoelectric actuator in some instances. The haptic feedback ring-shaped device 100 may be configured to provide haptic or vibrational feedback to a user. A grounding spring 112 may be coupled to the flexible printed circuit assembly 104 and the inner shell 102 and/or outer shell 130 to provide grounding. In some embodiments, the grounding spring 112 may be coupled to a first flexible portion 114 of the flexible printed circuit assembly 104 between respective segments of the flexible printed circuit assembly 104. For example, the first flexible portion 114 may be positioned between a second segment and a third segment of the flexible printed circuit assembly 104, and a second flexible portion 116 may be positioned between the third segment and a fourth segment of the flexible printed circuit assembly 104. The grounding spring 112 may be used in conjunction with optional conductive foams disposed about the bend regions or flexible portions of the flexible printed circuit assembly 104. The bend regions or flexible portions may include exposed coverlay sections that provide access to cross-hatched copper ground, and the grounding spring 112 and/or conductive foams may couple the cross-hatched copper ground to the outer shell 130 and/or inner shell 102.

The antenna feed component 106, optional first microphone 108, and haptic feedback ring-shaped device 100 may be disposed on a first side of the flexible printed circuit assembly 104. The first side may be outward facing, or may face the outer shell 130 of the ring-shaped device 100.

Additional components may be disposed on a second side of the flexible printed circuit assembly 104. The second side may be opposite the first side and may be, in some instances, inward facing, or may face the inner shell 102.

For example, a speaker assembly 118 may be disposed on the second side of the flexible printed circuit assembly 104. The speaker assembly 118 may be disposed on a segment of the flexible printed circuit assembly 104 that is at an opposite end of the flexible printed circuit assembly 104 with respect to the antenna feed component 106, in some embodiments.

The ring-shaped device 100 may include one or more microphones configured to detect sound and/or generate an audio signal. The microphones may be positioned within the housing and may correspond to the locations of one or more microphone holes on the housing. A second microphone 132 may be disposed adjacent to the speaker assembly 118. The second microphone 132 may be configured to detect voice input.

The flexible printed circuit assembly 104 may be coupled to the battery 120. The battery 120 may be coupled to the flexible printed circuit assembly 104 using, for example, a flexible jumper component. The flexible jumper component may be used to form an electrical connection between the battery 120 and the flexible printed circuit assembly 104, and may remove the need for soldering in some instances. The flexible jumper component may be configured to electrically couple the flexible printed circuit assembly 104 and the curved battery 120, where the flexible jumper component may be disposed between a first end of the flexible printed circuit assembly 104 and a second end of the battery.

The battery 120 may be coupled to a charging contact assembly 126. The charging contact assembly 126 may include one or more charging contacts that can be used to electrically couple the ring-shaped device 100 to a charger in order to charge the battery 120. In some embodiments, the charging contacts may be inward facing (e.g., with respect to a center of the ring, etc.), while in other embodiments, the charging contacts may be outward facing (e.g., with respect to the outer shell 130, away from the ring, etc.). The charging contact assembly 126 may be coupled to the inner shell 102 and/or the outer shell 130. In some embodiments, the charging contact may be coupled to the inner shell 102 via the charging contact assembly 126, and the charging contact may be oriented in an inward facing orientation, or towards a center of the ring-shaped device 100. A grounding bridge 128 may be coupled to the battery 120 to provide grounding. The grounding bridge 128 may be coupled to the inner shell 102 and/or the outer shell 130.

A carrier component 136, which may be a plastic or glass bracket, may support the antenna element 140. The plastic carrier component 136 may include a curved body portion and one or more raised portions. The plastic carrier component 136 may at least partially separate the antenna element 140 from the outer shell 130 and/or the inner shell 102. For example, the plastic carrier component 136 may be disposed in the housing of the ring-shaped device 100 between the antenna element 140 and the inner shell 102, and may include raised portion(s) that are disposed between the antenna element 140 and the outer shell 130. In some embodiments, a portion of the plastic carrier component 136 may be externally visible. Accordingly, the plastic carrier component 136 may optionally form at least a portion of the outer surface of the housing of the ring-shaped device 100. A microphone vent seal 138 may be disposed on an outer surface of the plastic carrier component 136 and may provide sealing for the first microphone 108.

The ring-shaped device 100 may include one or more pressable or physical buttons. For example, the ring-shaped device 100 may include a button assembly 134 may be disposed along a lower portion of the housing of the ring-shaped device 100. The button assembly 134 may include one or more buttons that can be used, for example, to initiate a voice command to the ring-shaped device 100. The button assembly 134 may be coupled to the outer shell 130. Any number of buttons or manually configurable inputs may be included.

One or more audio ports and/or perforated holes for audio may be disposed on the outer shell 130 adjacent to the button assembly 134 and may allow for sound to exit the housing, but may prevent solid particle ingress. Microphone ports and/or speaker ports may be sealed using mesh and membrane to increase water resistance and/or for waterproofing.

Example embodiments of the disclosure provide a number of technical features or technical effects. For example, in accordance with example embodiments of the disclosure, certain embodiments of the disclosure may reduce space consumed by separate antenna and battery assemblies, increase mechanical strength, and/or reduce device footprints. The above examples of technical features and/or technical effects of example embodiments of the disclosure are merely illustrative and not exhaustive.

One or more illustrative embodiments of the disclosure have been described above. The above-described embodiments are merely illustrative of the scope of this disclosure and are not intended to be limiting in any way. Accordingly, variations, modifications, and equivalents of the embodiments disclosed herein are also within the scope of this disclosure. The above-described embodiments and additional and/or alternative embodiments of the disclosure will be described in detail hereinafter through reference to the accompanying drawings.

Illustrative Embodiments and Use Cases

Figure 2:
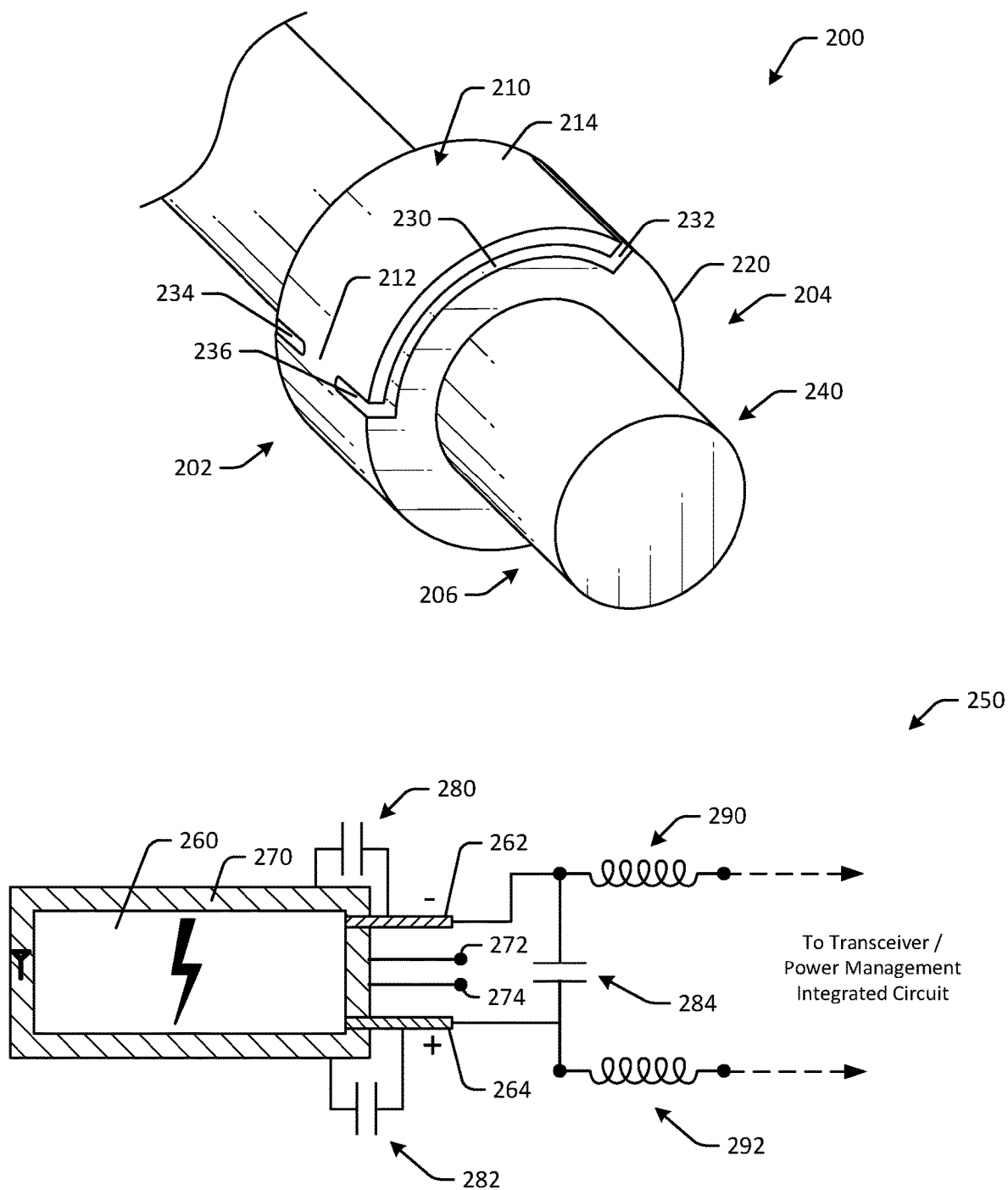
FIG. 2 is a perspective view and a schematic drawing of a ring-shaped device with combined battery and antenna in accordance with one or more embodiments of the disclosure.

FIG. 2 is a perspective view and a schematic drawing of a ring-shaped device with a combined battery and antenna assembly in accordance with one or more embodiments of the disclosure. Other embodiments may include additional, fewer, and/or different components. Some or all of the components illustrated in FIG. 2 may not be illustrated to scale. The devices illustrated in FIG. 2 may be the same or different than the device discussed with respect to FIG. 1.

In FIG. 2, a ring-shaped device 200 is illustrated in perspective view. The ring-shaped device 200 may be worn around a user's finger 240. As depicted, the ring-shaped device 200 may have a consistent or uniform thickness in some embodiments, while in other embodiments, the ring-shaped device 200 may have a non-uniform thickness. For example, an upper portion of the ring-shaped device 200 may have a greater thickness than the side portions of the ring-shaped device 200. The upper portion of the ring-shaped device 200 may be exposed to the environment when worn by a user.

The ring-shaped device 200 may include an inner shell and an outer shell coupled to the inner shell. The outer shell and inner shell together may form a first side portion, a second side portion, and a lower portion of the ring-shaped device 200. The first side portion and/or the second side portion may be in contact with an adjacent finger(s) when worn by a user.

The ring-shaped device 200 may include an antenna element 210 coupled to the outer shell and the inner shell of the ring-shaped device 200. The antenna element 210 may form at least part of an upper portion of the ring-shaped device 200. In some embodiments, an outer surface 214 of the antenna element 210 may be flush with an outer surface 220 of the outer shell of the ring-shaped device 200. In other embodiments, the outer surface 214 (e.g., outward facing) of the antenna element 210 may be raised relative to the outer surface 220 of the outer shell. The antenna element 210 may have a curved contour and may be formed of metal or a metallic material. For example, the antenna element 210 may include a metal shroud that at least partially surrounds the battery. In another example, the antenna element 210 may include an internal cavity, so as to form a housing, and the battery may be disposed within the internal cavity (e.g., inside the housing). A battery may be disposed adjacent to the antenna element 210. For example, the battery may be adhered to an inner surface of the antenna element 210, and may therefore be positioned underneath the antenna element 210 inside the ring-shaped device 200. A flexible printed circuit assembly may be positioned inside the ring-shaped device 200 and disposed along the first side portion and/or the second side portion of the ring-shaped device 200. The flexible printed circuit assembly may be coupled to the antenna element 210 and the battery.

The ring-shaped device 200 may include a carrier component 230. The carrier component 230 may be plastic, glass, or another suitable material configured to separate the antenna element 210 from the inner shell and/or outer shell of the ring-shaped device 200. The separation may improve the performance of the antenna element 210. The carrier component 230 may include one or more portions. In some embodiments, the carrier component 230 may have a substantially rectangular geometry. In the illustrated embodiment, the carrier component 230 includes a first curved portion (indicated by reference element 230) disposed along a first side of the ring-shaped device 200, a second portion 232 disposed across a width of the ring-shaped device 200, a third curved portion on a side of the ring-shaped device 200 opposite the first curved portion, and a fourth portion disposed across the width of the ring-shaped device 200. The fourth portion may be separated into two or more disjointed segments in some embodiments, or two or more joined segments in other embodiments. For example, in FIG. 2, the fourth portion may include a first segment 234 that extends partially across the width of the ring-shaped device 200, and a second segment 236 that extends partially across the width of the ring-shaped device 200. The first segment 234 and the second segment 236 may be separated by a portion 212 of the ring-shaped device 200. The portion 212 may be part of the antenna element 210 or a separate component. The portion 212 may cover an area where antenna feed, antenna ground, and/or battery leads may be routed to the antenna element 210 and/or battery. The portion 212 may therefore serve to provide an area underneath where connections to the antenna element and/or battery can be made, while being invisible to a user. In some embodiments, the portion 212 may be buried under the carrier component 230 for uniform aesthetic effect.

The first curved portion of the carrier component 230 may be continuous and may be disposed along a continuous side of the antenna element 210. A continuous side may indicate a side in which there are no interruptions to the carrier component 230. In some embodiments, the carrier component 230 may include a curved portion 230 disposed between the antenna element 210 and the inner shell of the ring-shaped device 200, a first raised portion (e.g., second portion 232) disposed between a first side of the antenna element 210 and the outer shell, the first raised portion having a first length, and a second raised portion (e.g., first segment 234) disposed between a second side of the antenna element 210 and the outer shell, the second raised portion having a second length that is less than the first length. The second raised portion may be disposed adjacent to another raised portion (e.g., second segment 236) that is coaxially aligned with the first raised portion.

In an embodiment, the carrier component 230 may include a first continuous curved portion (e.g., first curved portion 230), a second continuous curved portion (e.g., second portion 232) transverse to the first curved portion 230, a third continuous curved portion parallel to the first curved portion 230, and a fourth non-continuous curved portion (e.g., first segment 234 and second segment 236) parallel to the second continuous curved portion 232. The first continuous curved portion 230 and the third continuous curved portion are disposed along side surfaces of the ring-shaped device 200, and the second continuous curved portion and fourth continuous curved portion are disposed along an outer surface 220 of the ring-shaped device 200.

The ring-shaped device 200 may include a first side portion 202 having a first thickness, and a second side portion 204 having the same first thickness. The ring-shaped device 200 may include a lower portion 206 that has the first thickness or a different thickness that is less than the first thickness. The first thickness may be equal to, less than, or greater than a second thickness of the lower portion, and/or a third thickness of the upper portion of the ring-shaped device 200. In some embodiment, a thickness of the ring-shaped device 200 may be uniform.

A portion of the ring-shaped device 200 is illustrated in schematic view 250. In the illustrated example, the antenna element 210 may be a metal housing 270 that encapsulates, or at least partially surrounds, a battery 260. The battery 260 may be a flexible pouch battery. A volume of the metal housing 270 may be greater than that of the battery 260, so as to allow for expansion of the battery 260 due to heat, etc.

The antenna element or metal housing 270 may be coupled to an antenna feed 272 that provides a connection to an antenna feed component and/or a flexible printed circuit assembly. The antenna element or metal housing 270 may be coupled to an antenna ground 274 to provide grounding, and may optionally be coupled to the flexible printed circuit assembly.

The battery 260 may include, or may be coupled to, a positive battery lead 262 and a negative battery lead 264. The positive battery lead may be isolated from the antenna element 270, and the negative battery lead 264 may be isolated from the antenna element 270. Isolation may include direct current isolation. The positive battery lead 262 and the negative battery lead 264 may be coupled to a power management integrated circuit and/or transistor of the ring-shaped device.

The positive battery lead 262 and the negative battery lead 264 may be shorted to the metal housing 270 for alternating current via one or more radio frequency bypass capacitors. For example, the ring-shaped device may include a first bypass capacitor 280 coupled to the antenna element (e.g., metal housing 270 in this example) and the positive battery lead 272. The ring-shaped device may include a second bypass capacitor 282 coupled to the antenna element 270 and the negative battery lead 274. In some embodiments, an optional third bypass capacitor 284 may be coupled to the positive battery lead 262 and the negative battery lead 264. The radio frequency bypass capacitors may prevent radio frequency energy from being absorbed by the battery 260. The radio frequency bypass capacitors may short circuit energy, such that the combined battery and antenna assembly acts as a single unit, and radio frequency energy is coupled into the metal housing 270.

One or more inductors may be used to choke the battery 260 to prevent radio frequency energy from entering the battery. For example, a first inductor 290 may be disposed between the positive battery lead 262 and the power management integrated circuit, and a second inductor 292 may be disposed between the negative battery lead 264 and the power management integrated circuit.

Accordingly, the performance of the antenna element 210, 270 may be maintained or improved while combining the positioning of the battery within the ring-shaped device to align with the antenna element 210, 270 at the upper portion of the device. A device size and/or footprint can therefore be reduced, as less internal volume is needed to accommodate the components of the device.

Figure 3:
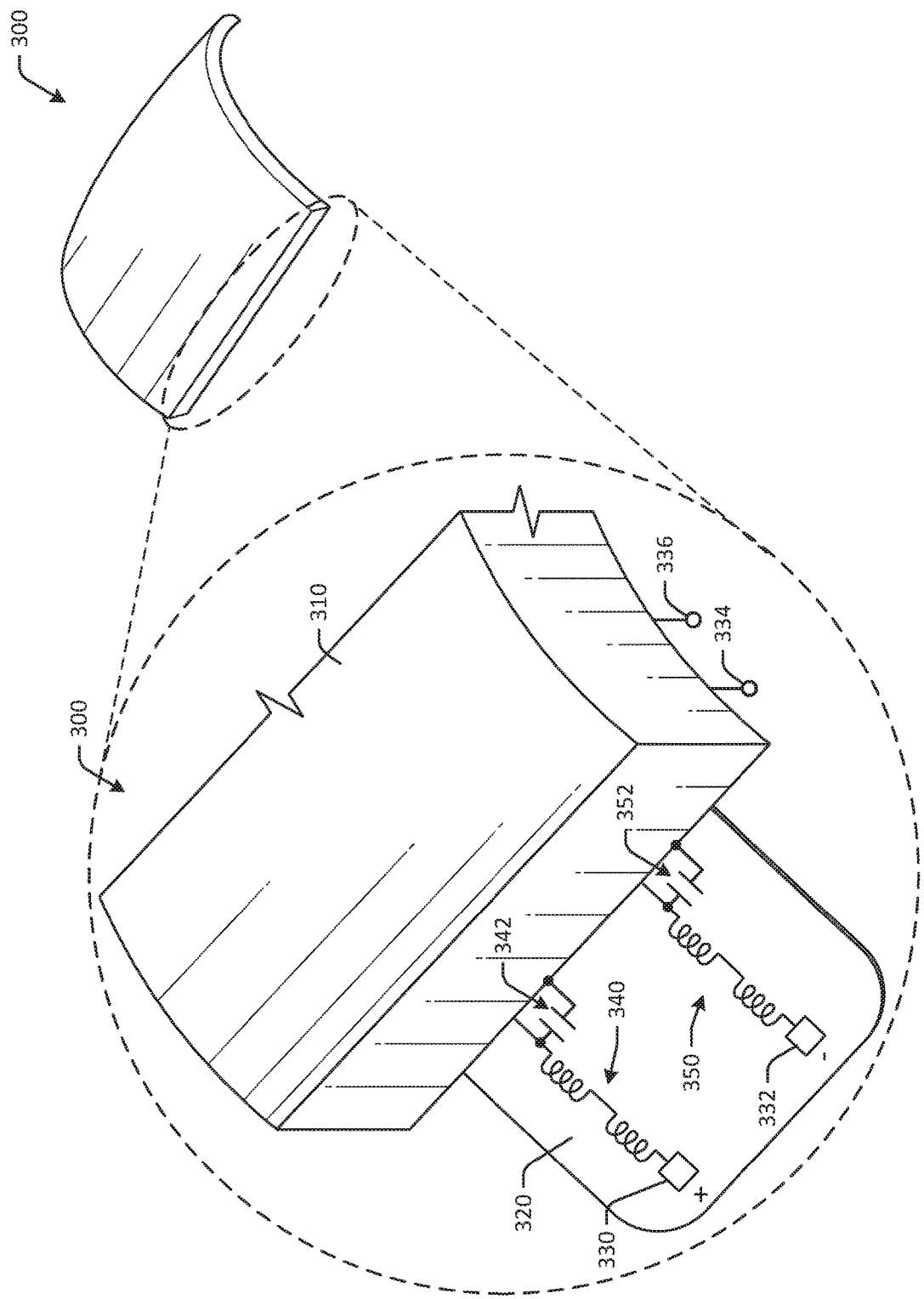
FIG. 3 is a schematic drawing of a portion of a ring-shaped device with combined battery and antenna in accordance with one or more embodiments of the disclosure.

FIG. 3 is a schematic drawing of a portion of a ring-shaped device with a combined battery and antenna assembly 300 in accordance with one or more embodiments of the disclosure. Other embodiments may include additional, fewer, and/or different components. The ring-shaped device may be any of the ring-shaped devices discussed with respect to FIGS. 1-2.

In FIG. 3, the combined battery and antenna assembly 300 may utilize a first antenna feed method. Specifically, the combined battery and antenna assembly 300 may include an antenna element 310 and a battery disposed adjacent to the antenna element 310. An antenna ground 336 and an antenna feed 334 may be disposed along a lateral edge of the combined battery and antenna assembly 300. In other embodiments, the location of the feed and ground may be modified based on the geometry of the device. The antenna feed 334 and antenna ground 336 may be directed coupled to the metal shroud of the antenna element 310.

A flexible circuit 320 may be coupled to the antenna element 310 and/or the battery. The flexible circuit 320 may include direct current power connections, including a positive contact 330 and a negative contact 332. Between the battery and the positive contact 330, one or more radio frequency chokes may be used to prevent radio frequency energy from entering the battery. For example, two radio frequency chokes 340 may be disposed between the battery and the positive contact 330. Similarly, two radio frequency chokes 350 may be disposed between the battery and the negative contact 332. The battery leads (e.g., positive contact 330 is part of positive lead, negative contact 332 is part of negative lead) may be direct current isolated from the metal shroud of the antenna element 310.

One or more radio frequency bypass capacitors may be used to prevent radio frequency energy from entering the battery. For example, a first radio frequency bypass capacitor 342 may be disposed between a first inductor 340 and the metal shroud in a parallel arrangement. Similarly, a second radio frequency bypass capacitor 352 may be disposed between a first inductor 350 and the metal shroud in a parallel arrangement. The radio frequency bypass capacitors 342, 352 may be coupled to the metal shroud of the antenna element 310.

Figure 4:
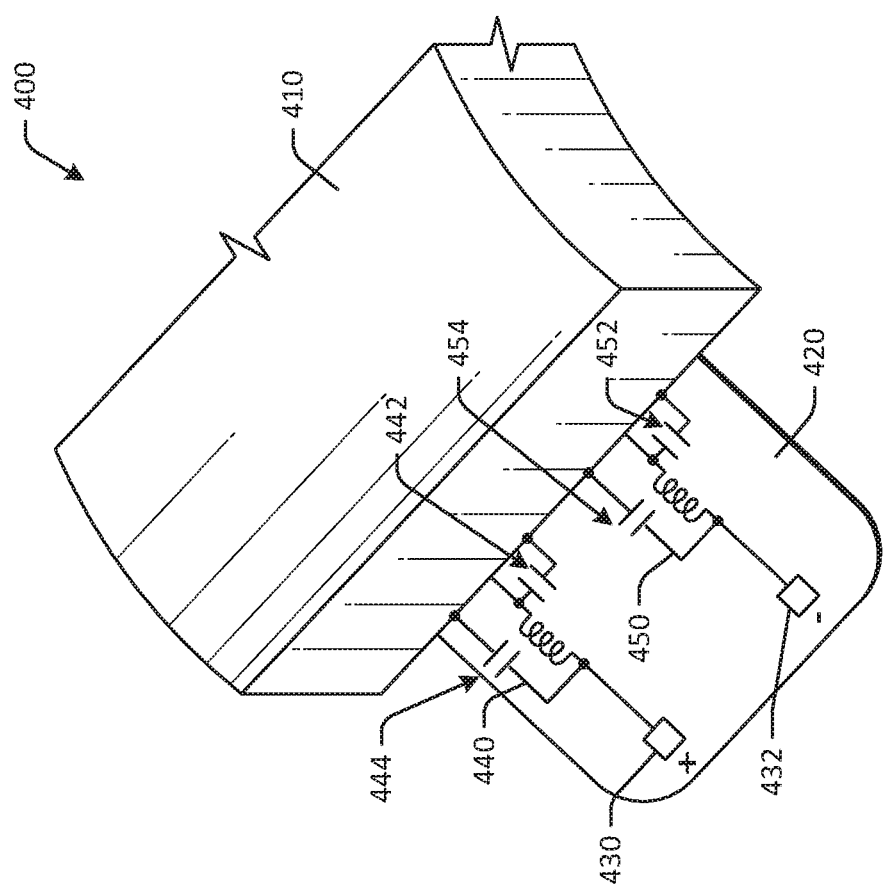
FIG. 4 is a schematic drawing of a portion of a ring-shaped device with combined battery and antenna in accordance with one or more embodiments of the disclosure.

FIG. 4 is a schematic drawing of a portion of a ring-shaped device with a combined battery and antenna assembly 400 in accordance with one or more embodiments of the disclosure. Other embodiments may include additional, fewer, and/or different components. The ring-shaped device may be any of the ring-shaped devices discussed with respect to FIGS. 1-3.

In FIG. 4, the combined battery and antenna assembly 400 may utilize a second antenna feed method. Specifically, the combined battery and antenna assembly 400 may include an antenna element 410 and a battery disposed adjacent to the antenna element 410. The antenna element 410 may include a metal shroud.

A flexible circuit 420 may be coupled to the antenna element 410 and/or the battery. The flexible circuit 420 may include direct current power connections, including a positive contact 430 and a negative contact 432. An antenna ground and an antenna feed may be combined with the positive contact 430 and the negative contact 432. For example, the positive contact 430 may serve as the antenna feed, and the negative contact 432 may serve as the antenna ground.

Between the battery and the positive contact 430, one or more radio frequency chokes may be used to prevent radio frequency energy from entering the battery. For example, a radio frequency choke 440 may be disposed between the battery and the positive contact 430. The battery may also be directly coupled to the positive contact 430. Similarly, a radio frequency choke 450 may be disposed between the battery and the negative contact 432. The battery may also be directly coupled to the negative contact 432. The battery leads (e.g., positive contact 430 is part of positive lead, negative contact 432 is part of negative lead) may be direct current isolated from the metal shroud of the antenna element 410.

One or more radio frequency bypass capacitors may be used to prevent radio frequency energy from entering the battery. For example, a first radio frequency bypass capacitor 442 may be disposed between a first inductor (e.g., radio frequency choke 440) and the metal shroud in a parallel arrangement. Similarly, a second radio frequency bypass capacitor 452 may be disposed between a second inductor (e.g., radio frequency choke 450) and the metal shroud in a parallel arrangement. The radio frequency bypass capacitors 442, 452 may be coupled to the metal shroud of the antenna element 410. An optional third radio frequency bypass capacitor 444 may be disposed between the positive contact 430 and the metal shroud in a parallel arrangement with respect to the radio frequency choke 440. Similarly, an optional fourth radio frequency bypass capacitor 454 may be disposed between the negative contact 432 and the metal shroud in a parallel arrangement with respect to the radio frequency choke 450.

Figure 5:
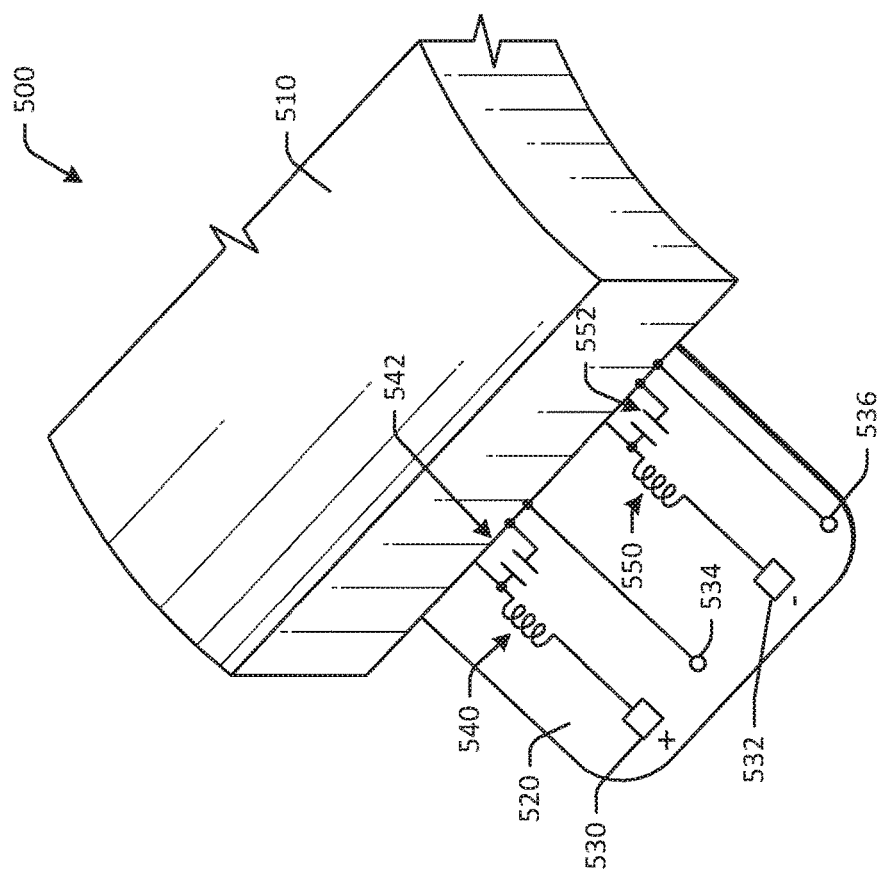
FIG. 5 is a schematic drawing of a portion of a ring-shaped device with combined battery and antenna in accordance with one or more embodiments of the disclosure.

FIG. 5 is a schematic drawing of a portion of a ring-shaped device with a combined battery and antenna assembly 500 in accordance with one or more embodiments of the disclosure. Other embodiments may include additional, fewer, and/or different components. The ring-shaped device may be any of the ring-shaped devices discussed with respect to FIGS. 1-4.

In FIG. 5, the combined battery and antenna assembly 500 may utilize a third antenna feed method. Specifically, the combined battery and antenna assembly 500 may include an antenna element 510 and a battery disposed adjacent to the antenna element 510. The antenna element 510 may include a metal shroud.

A flexible circuit 520 may be coupled to the antenna element 510 and/or the battery. The flexible circuit 520 may include direct current power connections, including a positive contact 530 and a negative contact 532. The flexible circuit 520 may include an antenna ground 536 and an antenna feed 534 disposed on the flexible circuit 520. For example, the positive contact 530 may be adjacent to the antenna feed 534, and the negative contact 532 may be adjacent to the antenna ground 536. The antenna feed 534 may be coupled to the metal shroud of the antenna element 510.

Between the battery and the positive contact 430, one or more radio frequency chokes may be used to prevent radio frequency energy from entering the battery. For example, a radio frequency choke 540 may be disposed between the battery and the positive contact 530. The battery may also be directly coupled to the positive contact 530. Similarly, a radio frequency choke 550 may be disposed between the battery and the negative contact 532. The battery may also be directly coupled to the negative contact 532. The battery leads (e.g., positive contact 530 is part of positive lead, negative contact 532 is part of negative lead) may be direct current isolated from the metal shroud of the antenna element 510.

One or more radio frequency bypass capacitors may be used to prevent radio frequency energy from entering the battery. For example, a first radio frequency bypass capacitor 542 may be disposed between the choke 540 and the metal shroud. Similarly, a second radio frequency bypass capacitor 552 may be disposed between the choke 550 and the metal shroud in a parallel arrangement. The radio frequency bypass capacitors 542, 552 may be coupled to the metal shroud of the antenna element 510.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by the execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Illustrative Device Architecture

Figure 6:
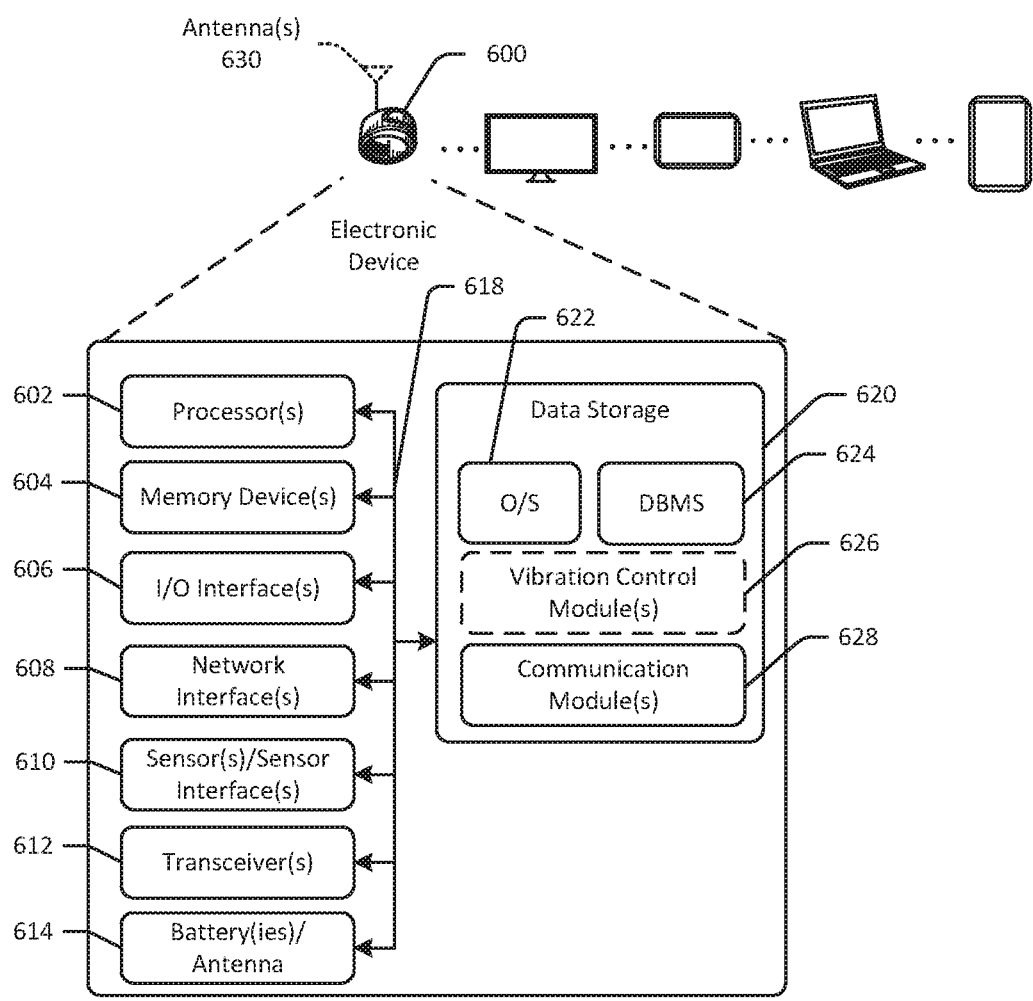
FIG. 6 schematically illustrates an example architecture of a device with combined battery and antenna in accordance with one or more embodiments of the disclosure.

FIG. 6 is a schematic block diagram of one or more illustrative electronic device(s) 600 in accordance with one or more example embodiments of the disclosure. The electronic device(s) 600 may include any suitable computing device with or without a display, in some instances, including, but not limited to, a server system, a mobile device, a wearable device, or the like; a content streaming device; a scanning device; a speaker device; or the like. The electronic device(s) 600 may correspond to an illustrative device configuration for the ring-shaped devices of FIGS. 1-5.

The electronic device(s) 600 may be configured to communicate with one or more servers, user devices, or the like. The electronic device(s) 600 may be configured to determine voice commands, determine wakeword utterances, determine and/or control other devices, and other operations. The electronic device(s) 600 may be configured to emit light, detect sound, output audio content, and other functionality.

The electronic device(s) 600 may be configured to communicate via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Further, such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the electronic device(s) 600 may include one or more processors (processor(s)) 602, one or more memory devices 604 (also referred to herein as memory 604), one or more input/output (I/O) interface(s) 606, one or more network interface(s) 608, one or more sensor(s) or sensor interface(s) 610, one or more transceiver(s) 612, one or more optional speakers and/or microphones, one or more combined battery(ies) and antenna(s) 614, and data storage 620. The electronic device(s) 600 may further include one or more bus(es) 618 that functionally couple various components of the electronic device(s) 600. The electronic device(s) 600 may further include one or more optional antenna(s) 630 that may be coupled to the battery 614, and may include, without limitation, a cellular antenna for transmitting or receiving signals to/from a cellular network infrastructure, an antenna for transmitting or receiving Wi-Fi signals to/from an access point (AP), a Global Navigation Satellite System (GNSS) antenna for receiving GNSS signals from a GNSS satellite, a Bluetooth antenna for transmitting or receiving Bluetooth signals, a Near Field Communication (NFC) antenna for transmitting or receiving NFC signals, and so forth. These various components will be described in more detail hereinafter.

The bus(es) 618 may include at least one of a system bus, a memory bus, an address bus, or a message bus, and may permit the exchange of information (e.g., data (including computer-executable code), signaling, etc.) between various components of the electronic device(s) 600. The bus(es) 618 may include, without limitation, a memory bus or a memory controller, a peripheral bus, an accelerated graphics port, and so forth. The bus(es) 618 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnect (PCI) architecture, a PCI-Express architecture, a Personal Computer Memory Card International Association (PCMCIA) architecture, a Universal Serial Bus (USB) architecture, and so forth.

The memory 604 of the electronic device(s) 600 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 604 may include multiple different types of memory such as various types of static random access memory (SRAM), various types of dynamic random access memory (DRAM), various types of unalterable ROM, and/or writeable variants of ROM such as electrically erasable programmable read-only memory (EEPROM), flash memory, and so forth. The memory 604 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 620 may include removable storage and/or non-removable storage including, but not limited to, magnetic storage, optical disk storage, and/or tape storage. The data storage 620 may provide non-volatile storage of computer-executable instructions and other data. The memory 604 and the data storage 620, removable and/or non-removable, are examples of computer-readable storage media (CRSM) as that term is used herein.

The data storage 620 may store computer-executable code, instructions, or the like that may be loadable into the memory 604 and executable by the processor(s) 602 to cause the processor(s) 602 to perform or initiate various operations. The data storage 620 may additionally store data that may be copied to the memory 604 for use by the processor(s) 602 during the execution of the computer-executable instructions. Moreover, output data generated as a result of execution of the computer-executable instructions by the processor(s) 602 may be stored initially in the memory 604, and may ultimately be copied to the data storage 620 for non-volatile storage.

More specifically, the data storage 620 may store one or more operating systems (O/S) 622; one or more database management systems (DBMS) 624; and one or more program module(s), applications, engines, computer-executable code, scripts, or the like such as, for example, one or more vibration control module(s) 626 and/or one or more communication module(s) 628. Some or all of these module(s) may be sub-module(s). Any of the components depicted as being stored in the data storage 620 may include any combination of software, firmware, and/or hardware. The software and/or firmware may include computer-executable code, instructions, or the like that may be loaded into the memory 604 for execution by one or more of the processor(s) 602. Any of the components depicted as being stored in the data storage 620 may support functionality described in reference to corresponding components named earlier in this disclosure.

The data storage 620 may further store various types of data utilized by the components of the electronic device(s) 600. Any data stored in the data storage 620 may be loaded into the memory 604 for use by the processor(s) 602 in executing computer-executable code. In addition, any data depicted as being stored in the data storage 620 may potentially be stored in one or more datastore(s) and may be accessed via the DBMS 624 and loaded in the memory 604 for use by the processor(s) 602 in executing computer-executable code. The datastore(s) may include, but are not limited to, databases (e.g., relational, object-oriented, etc.), file systems, flat files, distributed datastores in which data is stored on more than one node of a computer network, peer-to-peer network datastores, or the like. In FIG. 6, an example datastore(s) may include, for example, speaker identification or user profile information, and/or other information.

The processor(s) 602 may be configured to access the memory 604 and execute the computer-executable instructions loaded therein. For example, the processor(s) 602 may be configured to execute the computer-executable instructions of the various program module(s), applications, engines, or the like of the electronic device(s) 600 to cause or facilitate various operations to be performed in accordance with one or more embodiments of the disclosure. The processor(s) 602 may include any suitable processing unit capable of accepting data as input, processing the input data in accordance with stored computer-executable instructions, and generating output data. The processor(s) 602 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 602 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 602 may be capable of supporting any of a variety of instruction sets.

Referring now to functionality supported by the various program module(s) depicted in FIG. 6, the vibration control module(s) 626 may include computer-executable instructions, code, or the like that responsive to execution by one or more of the processor(s) 602 may perform functions including, but not limited to, determining a length of vibration to generate, determining on and/or off time intervals or durations for haptic feedback devices, and the like.

The communication module(s) 628 may include computer-executable instructions, code, or the like that responsive to execution by one or more of the processor(s) 602 may perform functions including, but not limited to, sending and/or receiving data, including content, sending and/or receiving instructions and commands, and the like.

Referring now to other illustrative components depicted as being stored in the data storage 620, the O/S 622 may be loaded from the data storage 620 into the memory 604 and may provide an interface between other application software executing on the electronic device(s) 600 and the hardware resources of the electronic device(s) 600. More specifically, the O/S 622 may include a set of computer-executable instructions for managing the hardware resources of the electronic device(s) 600 and for providing common services to other application programs (e.g., managing memory allocation among various application programs). In certain example embodiments, the O/S 622 may control execution of the other program module(s). The O/S 622 may include any operating system now known or which may be developed in the future including, but not limited to, any server operating system, any mainframe operating system, or any other proprietary or non-proprietary operating system.

The DBMS 624 may be loaded into the memory 604 and may support functionality for accessing, retrieving, storing, and/or manipulating data stored in the memory 604 and/or data stored in the data storage 620. The DBMS 624 may use any of a variety of database models (e.g., relational model, object model, etc.) and may support any of a variety of query languages. The DBMS 624 may access data represented in one or more data schemas and stored in any suitable data repository including, but not limited to, databases (e.g., relational, object-oriented, etc.), file systems, flat files, distributed datastores in which data is stored on more than one node of a computer network, peer-to-peer network datastores, or the like. In those example embodiments in which the electronic device(s) 600 is a mobile device, the DBMS 624 may be any suitable lightweight DBMS optimized for performance on a mobile device.

Referring now to other illustrative components of the electronic device(s) 600, the input/output (I/O) interface(s) 606 may facilitate the receipt of input information by the electronic device(s) 600 from one or more I/O devices as well as the output of information from the electronic device(s) 600 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the electronic device(s) 600 or may be separate. The I/O devices may further include, for example, any number of peripheral devices such as data storage devices, printing devices, and so forth.

The I/O interface(s) 606 may also include an interface for an external peripheral device connection such as universal serial bus (USB), FireWire, Thunderbolt, Ethernet port or other connection protocol that may connect to one or more networks. The I/O interface(s) 606 may also include a connection to one or more of the antenna(s) 630 to connect to one or more networks via a wireless local area network (WLAN) (such as Wi-Fi) radio, Bluetooth, ZigBee, and/or a wireless network radio, such as a radio capable of communication with a wireless communication network such as a Long Term Evolution (LTE) network, WiMAX network, 3G network, a ZigBee network, etc.

The electronic device(s) 600 may further include one or more network interface(s) 608 via which the electronic device(s) 600 may communicate with any of a variety of other systems, platforms, networks, devices, and so forth. The network interface(s) 608 may enable communication, for example, with one or more wireless routers, one or more host servers, one or more web servers, and the like via one or more networks.

The antenna(s) 630 may include any suitable type of antenna depending, for example, on the communications protocols used to transmit or receive signals via the antenna(s) 630. Non-limiting examples of suitable antennae may include directional antennae, non-directional antennae, dipole antennae, folded dipole antennae, patch antennae, multiple-input multiple-output (MIMO) antennae, or the like. The antenna(s) 630 may be communicatively coupled to one or more transceivers 612 or radio components to which or from which signals may be transmitted or received.

As previously described, the antenna(s) 630 may include a cellular antenna configured to transmit or receive signals in accordance with established standards and protocols, such as Global System for Mobile Communications (GSM), 3G standards (e.g., Universal Mobile Telecommunications System (UMTS), Wideband Code Division Multiple Access (W-CDMA), CDMA2000, etc.), 4G standards (e.g., Long-Term Evolution (LTE), WiMax, etc.), direct satellite communications, or the like.

The antenna(s) 630 may additionally, or alternatively, include a Wi-Fi antenna configured to transmit or receive signals in accordance with established standards and protocols, such as the IEEE 802.11 family of standards, including via 2.4 GHz channels (e.g., 802.11b, 802.11g, 802.11n), 5 GHz channels (e.g., 802.11n, 802.11ac), or 60 GHz channels (e.g., 802.11ad). In alternative example embodiments, the antenna(s) 630 may be configured to transmit or receive radio frequency signals within any suitable frequency range forming part of the unlicensed portion of the radio spectrum.

The antenna(s) 630 may additionally, or alternatively, include a GNSS antenna configured to receive GNSS signals from three or more GNSS satellites carrying time-position information to triangulate a position therefrom. Such a GNSS antenna may be configured to receive GNSS signals from any current or planned GNSS such as, for example, the Global Positioning System (GPS), the GLONASS System, the Compass Navigation System, the Galileo System, or the Indian Regional Navigational System.

The transceiver(s) 612 may include any suitable radio component(s) for—in cooperation with the antenna(s) 630—transmitting or receiving radio frequency (RF) signals in the bandwidth and/or channels corresponding to the communications protocols utilized by the electronic device(s) 600 to communicate with other devices. The transceiver(s) 612 may include hardware, software, and/or firmware for modulating, transmitting, or receiving—potentially in cooperation with any of antenna(s) 630—communications signals according to any of the communications protocols discussed above including, but not limited to, one or more Wi-Fi and/or Wi-Fi direct protocols, as standardized by the IEEE 802.11 standards, one or more non-Wi-Fi protocols, or one or more cellular communications protocols or standards. The transceiver(s) 612 may further include hardware, firmware, or software for receiving GNSS signals. The transceiver(s) 612 may include any known receiver and baseband suitable for communicating via the communications protocols utilized by the electronic device(s) 600. The transceiver(s) 612 may further include a low noise amplifier (LNA), additional signal amplifiers, an analog-to-digital (A/D) converter, one or more buffers, a digital baseband, or the like.

The sensor(s)/sensor interface(s) 610 may include or may be capable of interfacing with any suitable type of sensing device such as, for example, inertial sensors, force sensors, thermal sensors, photocells, and so forth. Example types of inertial sensors may include accelerometers (e.g., MEMS-based accelerometers), gyroscopes, and so forth.

The combined battery(ies) and antenna(s) 614 may be any of the battery devices described herein, such as those described with respect to FIGS. 1-5. The device may include optional speaker(s) and/or microphone(s), which may include any device configured to output audio and/or any device configured to receive analog sound input or voice data.

It should be appreciated that the program module(s), applications, computer-executable instructions, code, or the like depicted in FIG. 6 as being stored in the data storage 620 are merely illustrative and not exhaustive and that processing described as being supported by any particular module may alternatively be distributed across multiple module(s) or performed by a different module. In addition, various program module(s), script(s), plug-in(s), Application Programming Interface(s) (API(s)), or any other suitable computer-executable code hosted locally on the electronic device(s) 600, and/or hosted on other computing device(s) accessible via one or more networks, may be provided to support functionality provided by the program module(s), applications, or computer-executable code depicted in FIG. 6 and/or additional or alternate functionality. Further, functionality may be modularized differently such that processing described as being supported collectively by the collection of program module(s) depicted in FIG. 6 may be performed by a fewer or greater number of module(s), or functionality described as being supported by any particular module may be supported, at least in part, by another module. In addition, program module(s) that support the functionality described herein may form part of one or more applications executable across any number of systems or devices in accordance with any suitable computing model such as, for example, a client-server model, a peer-to-peer model, and so forth. In addition, any of the functionality described as being supported by any of the program module(s) depicted in FIG. 6 may be implemented, at least partially, in hardware and/or firmware across any number of devices.

It should further be appreciated that the electronic device(s) 600 may include alternate and/or additional hardware, software, or firmware components beyond those described or depicted without departing from the scope of the disclosure. More particularly, it should be appreciated that software, firmware, or hardware components depicted as forming part of the electronic device(s) 600 are merely illustrative and that some components may not be present or additional components may be provided in various embodiments. While various illustrative program module(s) have been depicted and described as software module(s) stored in the data storage 620, it should be appreciated that functionality described as being supported by the program module(s) may be enabled by any combination of hardware, software, and/or firmware. It should further be appreciated that each of the above-mentioned module(s) may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other module(s). Further, one or more depicted module(s) may not be present in certain embodiments, while in other embodiments, additional module(s) not depicted may be present and may support at least a portion of the described functionality and/or additional functionality. Moreover, while certain module(s) may be depicted and described as sub-module(s) of another module, in certain embodiments, such module(s) may be provided as independent module(s) or as sub-module(s) of other module(s).

One or more operations of the methods, process flows, and/or use cases of FIGS. 1-5 may be performed by a device having the illustrative configuration depicted in FIG. 6, or more specifically, by one or more engines, program module(s), applications, or the like executable on such a device. It should be appreciated, however, that such operations may be implemented in connection with numerous other device configurations.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in the flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in the flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which can be used to store the information and which can be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

That which is claimed is:

1. A ring-shaped device comprising:
   a housing comprising a curved upper portion, a curved lower portion, a first curved side portion, and a second curved side portion;
   a curved antenna element that forms an outer surface of the upper portion of the housing, the curved antenna element comprising a metal housing having an internal cavity;
   a flexible battery disposed within the internal cavity;
   a positive battery lead coupled to the flexible battery;
   a negative battery lead coupled to the flexible battery;
   a power management integrated circuit;
   a first inductor disposed between the positive battery lead and the power management integrated circuit;
   a second inductor disposed between the negative battery lead and the power management integrated circuit;
   a flexible printed circuit assembly coupled to the curved antenna element and the flexible battery, the flexible printed circuit assembly disposed within the first curved side portion of the housing, the flexible printed circuit assembly comprising a microphone configured to receive speech input, a speaker assembly, and a switch, wherein the microphone and the speaker assembly are disposed within the curved lower portion of the housing; and
   a button assembly disposed along the curved lower portion of the housing, the button assembly comprising an externally accessible button configured to engage the switch on the flexible printed circuit assembly.

2. The ring-shaped device of claim 1, wherein the positive battery lead is RF isolated from the curved antenna element, and wherein the negative battery lead is RF isolated from the curved antenna element, the ring-shaped device further comprising:
   a first bypass capacitor coupled to the curved antenna element and the positive battery lead;
   a second bypass capacitor coupled to the curved antenna element and the negative battery lead; and
   a third bypass capacitor coupled to the positive battery lead and the negative battery lead.

3. The ring-shaped device of claim 1, further comprising:
   a carrier component configured to separate the curved antenna element from the housing of the ring-shaped device, the carrier component comprising:
   a first continuous curved portion;
   a second continuous curved portion transverse to the first continuous curved portion;
   a third continuous curved portion parallel to the first continuous curved portion; and
   a fourth non-continuous curved portion parallel to the second continuous curved portion, wherein the first continuous curved portion and the third continuous curved portion are disposed along side surfaces of the ring-shaped device, and the second continuous curved portion and fourth continuous curved portion are disposed along an outer surface of the ring-shaped device.

4. A ring-shaped device comprising:
   an inner shell;
   an outer shell coupled to the inner shell, wherein the outer shell and inner shell together form a first side portion, a second side portion, and a lower portion of the ring-shaped device;
   an antenna element coupled to the outer shell and the inner shell, wherein the antenna element forms an upper portion of the ring-shaped device;
   a battery adhered to the antenna element;
   a positive battery lead and a negative battery lead coupled to the battery;
   a power management integrated circuit;
   a first inductor disposed between the positive battery lead and the power management integrated circuit;
   a second inductor disposed between the negative battery lead and the power management integrated circuit; and
   a flexible printed circuit assembly disposed along the first side portion, wherein the flexible printed circuit assembly is coupled to the antenna element and the battery.

5. The ring-shaped device of claim 4, wherein the antenna element comprises a metal shroud that at least partially surrounds the battery.

6. The ring-shaped device of claim 4, wherein the antenna element comprises an internal cavity, and the battery is disposed within the internal cavity.

7. The ring-shaped device of claim 4, wherein the positive battery lead is isolated from the antenna element, and the negative battery lead is isolated from the antenna element, the ring-shaped device further comprising:
   a first bypass capacitor coupled to the antenna element and the positive battery lead; and
   a second bypass capacitor coupled to the antenna element and the negative battery lead.

8. The ring-shaped device of claim 7, further comprising:
   a third bypass capacitor coupled to the positive battery lead and the negative battery lead.

9. The ring-shaped device of claim 7, wherein the positive battery lead and the negative battery lead are coupled to the power management integrated circuit.

10. The ring-shaped device of claim 4, further comprising:
    an antenna feed coupled to the antenna element and the flexible printed circuit assembly; and
    an antenna ground coupled to the antenna element and the flexible printed circuit assembly.

11. The ring-shaped device of claim 4, further comprising:
    a carrier component configured to separate the antenna element from the inner shell, wherein the carrier component is disposed along a first side of the antenna element, a second side of the antenna element, and a third side of the antenna element.

12. The ring-shaped device of claim 11, wherein the carrier component comprises:
    a curved portion disposed between the antenna element and the inner shell;
    a first raised portion disposed between a first side of the antenna element and the outer shell, the first raised portion having a first length; and
    a second raised portion disposed between a second side of the antenna element and the outer shell, the second raised portion having a second length that is less than the first length.

13. The ring-shaped device of claim 4, wherein the first side portion has a first thickness, and the second side portion has the first thickness; and
    wherein the first thickness is equal to or less than a second thickness of the lower portion and a third thickness of the upper portion.

14. The ring-shaped device of claim 4, wherein the antenna element comprises a first aperture, and the outer shell comprises a second aperture, and wherein the flexible printed circuit assembly comprises:
    a first microphone aligned with the first aperture; and
    a second microphone aligned with the second aperture.

15. A ring-shaped device comprising:
    a ring-shaped housing comprising an outer shell, an inner shell, and an antenna element that forms a top portion of the ring-shaped device;
    a carrier component configured to separate the antenna element from the inner shell, wherein the carrier component comprises:
       a curved portion disposed between the antenna element and the inner shell;
       a first raised portion disposed between a first side of the antenna element and the outer shell, the first raised portion having a first length; and
       a second raised portion disposed between a second side of the antenna element and the outer shell, the second raised portion having a second length that is less than the first length;
    a curved battery disposed in the antenna element;
    a flexible printed circuit assembly disposed in a side of the ring shaped housing; and
    a first microphone disposed along a lower portion of the ring-shaped housing.

16. The ring-shaped device of claim 15, wherein the ring-shaped device is configured to receive speech input.

17. The ring-shaped device of claim 15, wherein the antenna element comprises an internal cavity having a first volume.

18. The ring-shaped device of claim 17, wherein the curved battery comprises a flexible pouch battery having a second volume that is less than the first volume.

19. The ring-shaped device of claim 15, wherein a thickness of the ring-shaped device is uniform along the ring-shaped device.

* * * * *